US005343078A

United States Patent [19]

Bullmer

[11] Patent Number: 5,343,078

[45] Date of Patent: Aug. 30, 1994

[54] ARRANGEMENT FOR PROVIDING A CURRENT-REGULATED CONTROL OF SEVERAL ACTUATORS WITH A CONTROL COMPUTER

[75] Inventor: Wolfgang Bullmer, Bietigheim-Bissingen, Fed. Rep. of Germany

[73] Assignee: Robert Bosch GmbH, Stuttgart

[21] Appl. No.: 135,802

[22] Filed: Oct. 13, 1993

[30] Foreign Application Priority Data

Oct. 13, 1992 [DE] Fed. Rep. of Germany ....... 4234421

[51] Int. Cl.[5] ......................... H02J 4/00; G01R 19/00

[52] U.S. Cl. ......................................... 307/41; 307/38; 364/481; 364/483

[58] Field of Search ............... 323/282, 283, 284, 285, 323/289, 351; 307/38, 41; 364/481, 483

[56] References Cited

U.S. PATENT DOCUMENTS 4,016,474 4/1977 Mason .............................. 307/38 X
4,514,619 4/1985 Kugelman ....................... 364/483 X
5,122,968 6/1992 Bauer et al. ......................... 364/483

*Primary Examiner*—Steven L. Stephan
*Assistant Examiner*—Y. Jessica Han
*Attorney, Agent, or Firm*—Walter Ottesen

[57] ABSTRACT

The invention is directed to an arrangement for the current-regulated control of several actuators by a control computer. An individual control transistor is provided for each actuator. A single measuring resistor in series with a further control transistor defines a measuring and control arrangement for all actuators. Each individual control transistor for the respective individual actuators is connected in series with respective resistors. The resistance value of each of the resistors corresponds to the resistance value of the measuring resistor. Furthermore, switching elements are provided and controlled by the control computer. The actuators are connected in series with the measuring and control arrangement for a pregiven measuring and control time by the switchover elements. The actuators are normally in series with the individual control transistors assigned thereto. A control-signal sequence is supplied to each of the control transistors with the control-signal sequences being adjusted at the ancillary control transistor during the pregiven measuring and control time for the actuator corresponding thereto. In this way, an individual current control for a large number of actuators is possible with a single measuring resistor. The control operations all take place in the control computer and no separate analog control circuits are required.

13 Claims, 1 Drawing Sheet

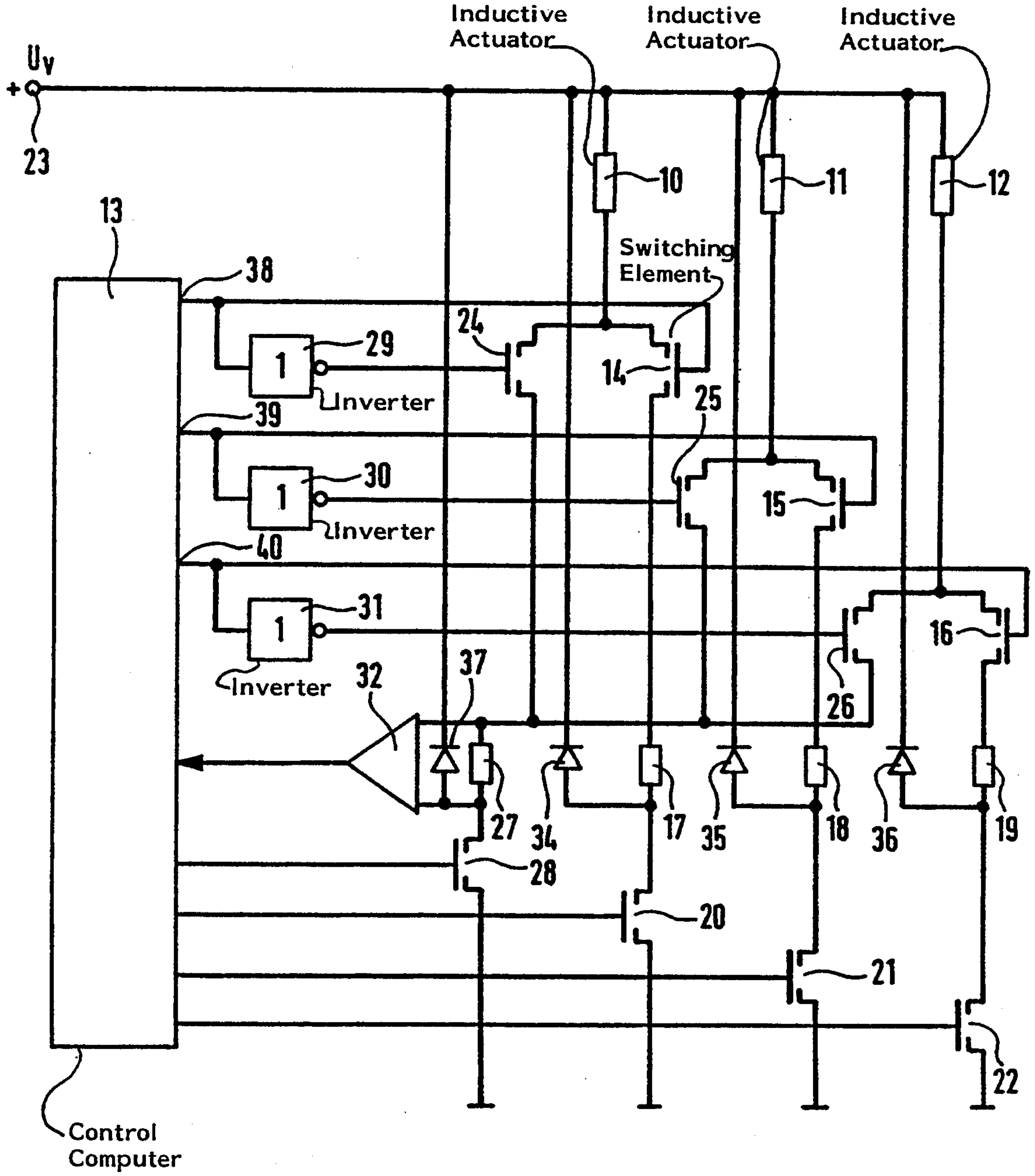
Uv
23
13
38
39
40
Inductive Actuator
Inductive Actuator
Inductive Actuator
10
11
12
Switching Element
24
14
25
15
16
26
29
30
31
1
1
1
Inverter
Inverter
Inverter
32
37
27
34
17
35
18
36
19
28
20
21
22
Control Computer

ARRANGEMENT FOR PROVIDING A CURRENT-REGULATED CONTROL OF SEVERAL ACTUATORS WITH A CONTROL COMPUTER

FIELD OF THE INVENTION

The invention relates to an arrangement for the current-regulated control of several actuators by means of a control computer. An individual control transistor is provided for each actuator and the detection of the actual current value takes place utilizing a measuring resistor.

BACKGROUND OF THE INVENTION

If several such actuators are controlled by a control computer in a manner known per se, then a separate measuring resistor is provided in the current loop of each actuator and an analog control loop is assigned to each actuator in which control loop the analog detected measured variable is converted into a control signal for influencing the pulse-duty factor of a control-signal sequence from the control computer. The analog circuit complexity becomes very considerable and leads to a costly configuration of the entire control arrangement especially when a large number of actuators are to be supplied with individually controlled currents. The number of necessary precise measuring resistors furthermore increases the cost.

SUMMARY OF THE INVENTION

It is an advantage of the invention that only a single measuring resistor is required in a single measuring loop even when there is a large number of individually controlled actuators. Special analog control circuits for driving the control transistors in the individual current loops of the actuators are no longer required. Rather, the drive takes place directly via the control computer and all control operations take place in this control computer. In this way, the circuit complexity and therefore the cost is significantly reduced and the number of connected actuators to be controlled can be very large. It is also possible to add further actuators without changing the control process itself. The only measuring resistor or measuring path can be used unchanged with an expansion of this kind.

The control terminals for the control transistors are connected either directly or via at least one amplifier stage to the control outputs of the control computer whereby the circuit complexity can be held to a minimum.

Taps of the measuring resistor are connected via a measuring amplifier to inputs of the control computer in order to sequentially supply the respective actual current values to the control computer. Even the circuit complexity for the detection of the current actual value is therefore very minimal.

The switchover means for each actuator include in a simplified manner two inversely controllable switching elements by means of which this actuator can either be connected to the measuring and control arrangement or connected to the associated individual control transistor. Accordingly, only two switching elements (and, if required, an inverter) are needed for the inverse control of the switching elements in order to realize the switchover means.

Furthermore, free-wheeling diodes are advantageously provided which bridge the actuator, the switching means and the resistor corresponding thereto in order to control to a current mean value.

The controllable switching elements and/or the control transistors and/or the free-wheeling diodes should all be of the same type and have the same characteristics. In this way, electrically identical conditions are present in the control loops, on the one hand, and in the measuring and control loop, on the other hand. In this way, the control-signal sequence detected in the measuring and control loop is easily accepted by the control loop.

The switchover by the switching means to the measuring and control arrangement takes place in the simplest case in a fixed time reference and/or in a fixed series sequence. Especially for a large number of actuators, the switchover of individual actuators via the switchover means to the measuring and control arrangement takes place in a narrower time reference and/or takes place more often with respect to the other actuators in order to obtain the most possible optimal control in an advantageous manner during dynamic changes. In this way, the dynamic operations are compensated quicker and with greater accuracy.

According to another embodiment of the invention, the time intervals between switchovers and/or the number of occurrences of the switchovers can be a function of the dynamic of the particular actuators.

BRIEF DESCRIPTION OF THE DRAWING

The invention will now be described with reference to the drawing which shows a circuit arrangement for controlling current of three actuators by a control computer.

DESCRIPTION OF THE PREFERRED EMBODIMENTS OF THE INVENTION

Three inductive actuators 10 to 12 are controlled in a current-regulated manner by a control computer 13 which, for example, can be a microcomputer. The inductive actuators can be, for example, electrohydraulic or electropneumatic actuators such as pressure controllers for the transmission control of a motor vehicle transmission or the like.

A switching element 14, a resistor 17 and a control transistor 20 are connected in series with actuator 10. The following are connected in series with actuator 11: a switching element 15, a resistor 18 and a control transistor 21. Also, the following are connected in series with actuator 12: a switching element 16, a resistor 19 and a control transistor 22. The three series circuits are each supplied with a supply voltage $U_v$ with the positive terminal 23 being connected to each of the actuators 10 to 12; whereas, the respective opposite-lying terminals of the series circuits are connected to ground or to the negative pole of the supply voltage $U_v$.

The control electrodes of the switching elements 14 to 16 as well as of the control transformers 20 to 22 are connected to control outputs of the control computer 13.

The terminals of the actuators 10 to 12 which are not at the positive terminal 23 are connected to each other via respective switching elements 24 to 26. The connecting circuit node is connected to ground with a further control transistor 28 via the series circuit of a measuring resistor 27. The switching elements 24 to 26 are controlled inversely to the switching elements 14 to 16, respectively. For this purpose, the control terminals of the switching elements 14 to 16 are connected to the control terminals of the switching elements 24 to 26, respectively, via respective inverters 29 to 31.

The two terminals of the measuring resistor 27 are connected to the inputs of a measuring amplifier 32 which, for example, can be a differential amplifier. The output of the measuring amplifier 32 is connected to an input of the control computer 13.

The connecting circuit nodes between the resistors 17 to 19 as well as measuring resistor 27 and the control transistors 20 to 22 as well as control transistor 28 are connected to the positive terminal 23 via free-wheeling diodes 34 to 37.

The measuring resistor 27 has the same resistance value as the resistors 17 to 19. All switching elements 14 to 16 as well as 24 to 26 are of the same type and have the same electrical characteristics. This applies also to the control transistors 20 to 22 as well as 28 with respect to each other and likewise applies to the free-wheeling diodes 34 to 37. The switching elements 14 to 16 as well as switching elements 24 to 26 are configured as switching transistors in the embodiment shown. However, they can also be realized by other known switches or semiconductor switches.

The operation of the embodiment shown in the drawing will now be explained.

During operation, first individual control-signal sequences are applied to the control transistors 20 to 22, respectively, from the control computer 13 in order to generate the respective desired current mean values in the inductive actuators 10 to 12, respectively. These desired current mean values are pregiven via desired values in the control computer 13 either via a program or via applied desired signals. During this operation, the switching elements 14 to 16 are current-conductive and the switching elements 24 to 26 are non-conductive. In the simplest case, control signals are now applied sequentially to the control outputs 38 to 40 of the control computer 13 which are connected to the respective switching elements 14 to 16. At first, a control signal should be present at the control output 38. The switching element 14 is rendered non-conductive by this control signal which, for example, can be a 0-signal and the switching element 24 becomes conductive.

At the same time, the control-signal sequence applied last to the control transistor 20 is supplied to the control transistor 28 so that, at first, the current mean value in the inductive actuator 10 is not changed since the series circuit, which comprises the switching element 14, the resistor 17 and the control transistor 20, is identical to the series circuit, which comprises the switching element 24, the measuring resistor 27 and the control transistor 28. The converted current value detected via the measuring resistor 27 and processed in the measuring amplifier 32 is supplied to the control computer 13 as an actual value. In the control computer 13, the actual value is compared to the pregiven desired value for the inductive actuator 10 by means of a conventional control program known per se. For a control deviation, the control-signal sequence for the control transistor 28 is changed so long until the control deviation is brought to zero. Then, the switching element 14 is again rendered conductive and the switching element 24 is rendered non-conductive by means of a control signal switchover at the control output 38. At the same time, the last adjusted control-signal sequence having a pulse-duty factor adapted to the desired value is supplied to the control transistor 20 so that the newly adjusted current value is maintained in the inductive actuator 10. The same operation continues sequentially for the remaining actuators 11 and 12 so that, after a cycle, all actuators 10 to 12 are again adjusted to their particular pregiven desired value with reference to the desired current mean value. The cycle can then begin anew.

The number of the actuators to be controlled in this manner is not limited to three; instead, additional actuators can be connected in parallel in the same manner. The greater the number of actuators to be driven via the control computer 13, the smaller the time span for the readjustment per cycle. For a larger number of actuators, the case therefore occurs that the particular readjusting time is too short during dynamic operations or that a time interval which is too great is present between two readjustment operations. A determination at which actuators 10 to 12 the desired value remains unchanged and at which actuators this desired value changes dynamically is made by the control computer 13. If a dynamic change is determined, then the affected actuator is readjusted more often, for example, every 20 ms; whereas, the remaining actuators having the static desired value are only readjusted approximately every second. The actuator subjected to a dynamic operation is therefore charged more often in shorter time intervals by the measuring and control arrangement comprising the measuring resistor 27 and the control transistor 28 in order to obtain a more precise readjustment of the current mean value which is adapted to the dynamic operation. The control signal sequence present at one of the control transistors 20 to 22 can change by means of interpolation in the control computer 13 outside of a measuring and control interval.

In order to control to a current mean value, it is absolutely necessary that the measuring resistor 27 or the corresponding resistor 17 to 19 lies in the other parallel paths within the free-wheeling loop with the free-wheeling loop being defined by the particular free-wheeling diode 37 or 34 to 36 and the particular actuator 10 to 12.

In a manner known per se, amplifier stages can be connected downstream of the control outputs of the control computer 13 when the control computer does not have the necessary output power for driving these control transistors at these control outputs connected to the control transistors 20 to 22 and 28. The same applies for the drive of the switching elements 14 to 16 as well as the switching elements 24 to 26.

It is understood that the foregoing description is that of the preferred embodiments of the invention and that various changes and modifications may be made thereto without departing from the spirit and scope of the invention as defined in the appended claims.

What is claimed is:

1. An arrangement for providing a current-regulated control of several actuators, the arrangement comprising:

a plurality of first control transistors corresponding to respective ones of said actuators;

a measuring and control arrangement for all of said actuators which includes a single measuring resistor for detecting respective actual current values in corresponding ones of said actuators and an ancillary control transistor connected in series with said measuring resistor;

said measuring resistor having a predetermined resistance value;

a plurality of first resistors connected in series with respective ones of said first control transistors;

each of said first resistors having a resistance value corresponding to said predetermined resistance value of said measuring resistor;

a plurality of switchover devices connected between respective ones of said actuators and respective ones of said first control transistors;

each of said switchover devices being switchable between a first state wherein the actuator and the first control transistor corresponding thereto are connected in series and a second state wherein the actuator is connected in series with said measuring and control arrangement;

a control computer connected to said switchover devices for sequentially switching said switching devices into said second state for a pregiven measuring and control time; and, said control computer also being connected to said first control transistors for applying a control signal sequence to each of said first control transistors with each of said control signal sequences being adjusted at the ancillary control transistor during the pregiven measuring and control time for the actuator corresponding thereto.

2. The arrangement of claim 1, said control computer having a plurality of control outputs; said first control transistors and said ancillary control transistor having respective control terminals connected directly to said control outputs, respectively.

3. The arrangement of claim 2, a plurality of amplifier stages interposed between corresponding ones of said control outputs and said control terminals.

4. The arrangement of claim 1, said control computer having an input and said measuring and control arrangement further comprising a measuring amplifier and said measuring resistor having terminals connected to said input via said measuring amplifier.

5. The arrangement of claim 1, each of said switching devices comprising two inversely controllable switching elements corresponding to said first and second states, respectively.

6. The arrangement of claim 1, further comprising a plurality of free-wheeling diodes; each of said diodes bridging an actuator, the switching device connected to the actuator and the first resistor connected to the first control transistor corresponding to the actuator.

7. The arrangement of claim 6, said switching devices and said control transistors all having the same electrical characteristics and being of the same type.

8. The arrangement of claim 7, said free-wheeling diodes having the same electrical characteristics and all being of the same type.

9. The arrangement of claim 1, said control computer being adapted to drive said switchover devices into said second state in a fixed time raster and/or in a fixed sequence.

10. The arrangement of claim 1, said control computer being adapted to drive said switchover devices into said second state during dynamic changes of the current in individual ones of said actuators in narrower time raster and/or more frequently compared to the remaining ones of said actuators.

11. The arrangement of claim 10, said control computer being adapted to provide desired values and to drive said switchover devices so that intervals between switchovers and/or so that said frequency with which said switchovers occur is a function of the dynamic of the current in the particular actuators or of the particular desired values.

12. The arrangement of claim 1, each of said actuators being configured as an inductive actuator.

13. The arrangement of claim 12, each of said actuators being configured as an electrohydraulic or electropneumatic actuator.

* * * * *